(12) United States Patent
Tseng et al.

(10) Patent No.: US 11,411,141 B2
(45) Date of Patent: Aug. 9, 2022

(54) MICRO SEMICONDUCTOR DEVICE

(71) Applicant: PlayNitride Display Co., Ltd., MiaoLi County (TW)

(72) Inventors: Yen-Chun Tseng, MiaoLi County (TW); Tzu-Yang Lin, MiaoLi County (TW); Jyun-De Wu, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 33 days.

(21) Appl. No.: 17/124,473

(22) Filed: Dec. 16, 2020

(65) Prior Publication Data
US 2022/0131046 A1 Apr. 28, 2022

(30) Foreign Application Priority Data
Oct. 26, 2020 (TW) ................................. 109137152

(51) Int. Cl.
*H01L 33/38* (2010.01)
*H01L 33/06* (2010.01)
*H01L 33/14* (2010.01)

(52) U.S. Cl.
CPC ............ *H01L 33/385* (2013.01); *H01L 33/06* (2013.01); *H01L 33/382* (2013.01); *H01L 33/145* (2013.01)

(58) Field of Classification Search
CPC .............................. H01L 33/382; H01L 33/145
See application file for complete search history.

(56) References Cited

U.S. PATENT DOCUMENTS

| 7,305,018 | B2 | 12/2007 | Otoma | |
| 2011/0266579 | A1* | 11/2011 | Nagai | H01L 27/156 257/E33.061 |
| 2011/0275173 | A1* | 11/2011 | Khaja | H01L 21/2654 257/E33.012 |
| 2012/0097918 | A1 | 4/2012 | Yu et al. | |
| 2015/0179873 | A1* | 6/2015 | Wunderer | H01L 33/48 257/13 |
| 2020/0251614 | A1 | 8/2020 | McGroddy et al. | |

FOREIGN PATENT DOCUMENTS

| TW | 202018979 | 5/2020 |
| TW | 202025504 | 7/2020 |

OTHER PUBLICATIONS

"Office Action of Taiwan Counterpart Application", dated Apr. 13, 2021, p. 1-p. 6.

* cited by examiner

*Primary Examiner* — Mark W Tornow
(74) *Attorney, Agent, or Firm* — JCIPRNET (57) ABSTRACT

A micro semiconductor device, including a semiconductor structure, a current confinement layer, a first type electrode, and a second type electrode, is provided. The current confinement layer is disposed in the semiconductor structure. The current confinement layer includes an oxidized area and a non-oxidized area. The first type electrode and the second type electrode are both disposed on the current confinement layer. An orthographic projection of a part of the oxidized area on a bottom surface of the semiconductor structure away from the first type electrode and the second type electrode is located between an orthographic projection of the first type electrode on the bottom surface and an orthographic projection of the second type electrode on the bottom surface.

17 Claims, 10 Drawing Sheets

MICRO SEMICONDUCTOR DEVICE

CROSS-REFERENCE TO RELATED APPLICATION

This application claims the priority benefit of Taiwan application serial no. 109137152, filed on Oct. 26, 2020. The entirety of the above-mentioned patent application is hereby incorporated by reference herein and made a part of this specification.

BACKGROUND

Technical Field

The disclosure relates to a semiconductor device, and more particularly to a micro semiconductor device.

Description of Related Art

Generally, when manufacturing the electrodes of a micro semiconductor device, the process (such as the dry etching process) used may easily produce surface defects around the electrodes. As a result, when current flows between the electrodes, current carriers (such as electrons/electron holes) and the surface defects will produce a surface recombination phenomenon and generate excess waste heat. Therefore, the presence of surface defects will have negative impacts on the performance of the micro semiconductor device.

SUMMARY

The disclosure provides a micro semiconductor device, which can reduce the probability of a surface recombination phenomenon produced by current carriers and surface defects while reducing the generation of excess waste heat to improve negative impacts on the performance of the micro semiconductor device due to the presence of the surface defects.

A micro semiconductor device of the disclosure includes a semiconductor structure, a current confinement layer, a first type electrode, and a second type electrode. The current confinement layer is disposed in the semiconductor structure. The current confinement layer includes an oxidized area and a non-oxidized area. The first type electrode and the second type electrode are both disposed on the current confinement layer. An orthographic projection of a part of the oxidized area on a bottom surface of the semiconductor structure away from the first type electrode and the second type electrode is located between an orthographic projection of the first type electrode on the bottom surface and an orthographic projection of the second type electrode on the bottom surface.

In an embodiment of the disclosure, a resistance value of the oxidized area is greater than a resistance value of the non-oxidized area.

In an embodiment of the disclosure, the semiconductor structure further includes a first type semiconductor layer, a second type semiconductor layer, and a light emitting layer. The first type semiconductor layer is disposed on the semiconductor structure. The second type semiconductor layer is disposed on the first type semiconductor layer. The light emitting layer is disposed between the first type semiconductor layer and the second type semiconductor layer.

In an embodiment of the disclosure, the current confinement layer is located in the second type semiconductor layer.

In an embodiment of the disclosure, the second type semiconductor layer includes a first part and a second part. The first part is located between the current confinement layer and the light emitting layer. The current confinement layer is located between the first part and the second part.

In an embodiment of the disclosure, a doping concentration of the first part is less than a doping concentration of the second part.

In an embodiment of the disclosure, the orthographic projection of the first type electrode on the semiconductor structure and an orthographic projection of the non-oxidized area on the semiconductor structure at least partially overlap.

In an embodiment of the disclosure, the orthographic projection of the first type electrode on the semiconductor structure and the orthographic projection of the non-oxidized area on the semiconductor structure completely overlap.

In an embodiment of the disclosure, an edge of the oxidized area is aligned with an edge of the current confinement layer.

In an embodiment of the disclosure, there is a distance between an edge of the oxidized area and an edge of the current confinement layer.

In an embodiment of the disclosure, the current confinement layer is located in the first type semiconductor layer.

In an embodiment of the disclosure, the current confinement layer is at least two layers of current confinement layers, one of the at least two layers of current confinement layers is located in the first type semiconductor layer, and another one of the at least two layers of current confinement layers is located in the second type semiconductor layer.

In an embodiment of the disclosure, orthographic projections of a non-oxidized area of one of the at least two layers of current confinement layers and a non-oxidized area of another one of the at least two layers of current confinement layers on the bottom surface at least partially overlap.

In an embodiment of the disclosure, orthographic projections of a non-oxidized area of one of the at least two layers of current confinement layers and a non-oxidized area of another one of the at least two layers of current confinement layers on the bottom surface are completely misaligned.

In an embodiment of the disclosure, in an arrangement direction of the first type electrode and the second type electrode, a junction between the oxidized area and the non-oxidized area is located between the first type electrode and the second type electrode.

A micro semiconductor device of the disclosure includes a semiconductor structure, a current confinement layer, a first type electrode, and a second type electrode. The current confinement layer is disposed in the semiconductor structure. The current confinement layer includes an oxidized area and a non-oxidized area. The first type electrode and the second type electrode are both disposed on the current confinement layer. The second type electrode has a through hole extending toward a bottom surface of the semiconductor structure away from the first type electrode and the second type electrode. The oxidized area surrounds the first type electrode, the second type electrode, or a combination thereof.

Based on the above, the current confinement layer in the micro semiconductor device of the disclosure includes the oxidized area and the non-oxidized area, and at least a part of the oxidized area is designed to be located between the electrodes or the oxidized area is designed to surround the electrodes. The direction of current flow is effectively controlled using the difference in resistance values of the oxidized area and the non-oxidized area, so that it is difficult for current carriers to laterally diffuse between the electrodes, thereby reducing the probability of the current carriers passing through a surface defect part between the electrodes. Therefore, the micro semiconductor device of the disclosure may reduce the probability of a surface recombination phenomenon produced by the current carriers and surface defects while reducing the generation of excess waste heat to improve negative impacts on the performance of the micro semiconductor device due to the presence of the surface defects.

In order for the features and advantages of the disclosure to be more comprehensible, the following specific embodiments are described in detail in conjunction with the accompanying drawings.

BRIEF DESCRIPTION OF THE DRAWINGS

FIG. 1B is a schematic top view of the micro semiconductor device of FIG. 1A, where FIG. 1A is a partial cross-sectional view along a line A-A' in FIG. 1B.

FIG. 5B is a schematic top view of the micro semiconductor device of FIG. 5A, where FIG. 5A is a partial cross-sectional view along a line B-B' in FIG. 5B.

In particular, for the sake of clarity, FIGS. 1B and 5B are drawn in perspective.

DETAILED DESCRIPTION OF DISCLOSED EMBODIMENTS

The detailed features and advantages of the disclosure are described in detail in the following embodiments. The content is sufficient for persons skilled in the art to understand the technical content of the disclosure to be implemented accordingly. Also, according to the content, claims, and drawings disclosed in this specification, persons skilled in the art may easily understand the relevant objective and advantages of the disclosure. The following embodiments further illustrate in detail the viewpoint of the disclosure, but do not limit the scope of the disclosure by any viewpoint.

Figure 1A:
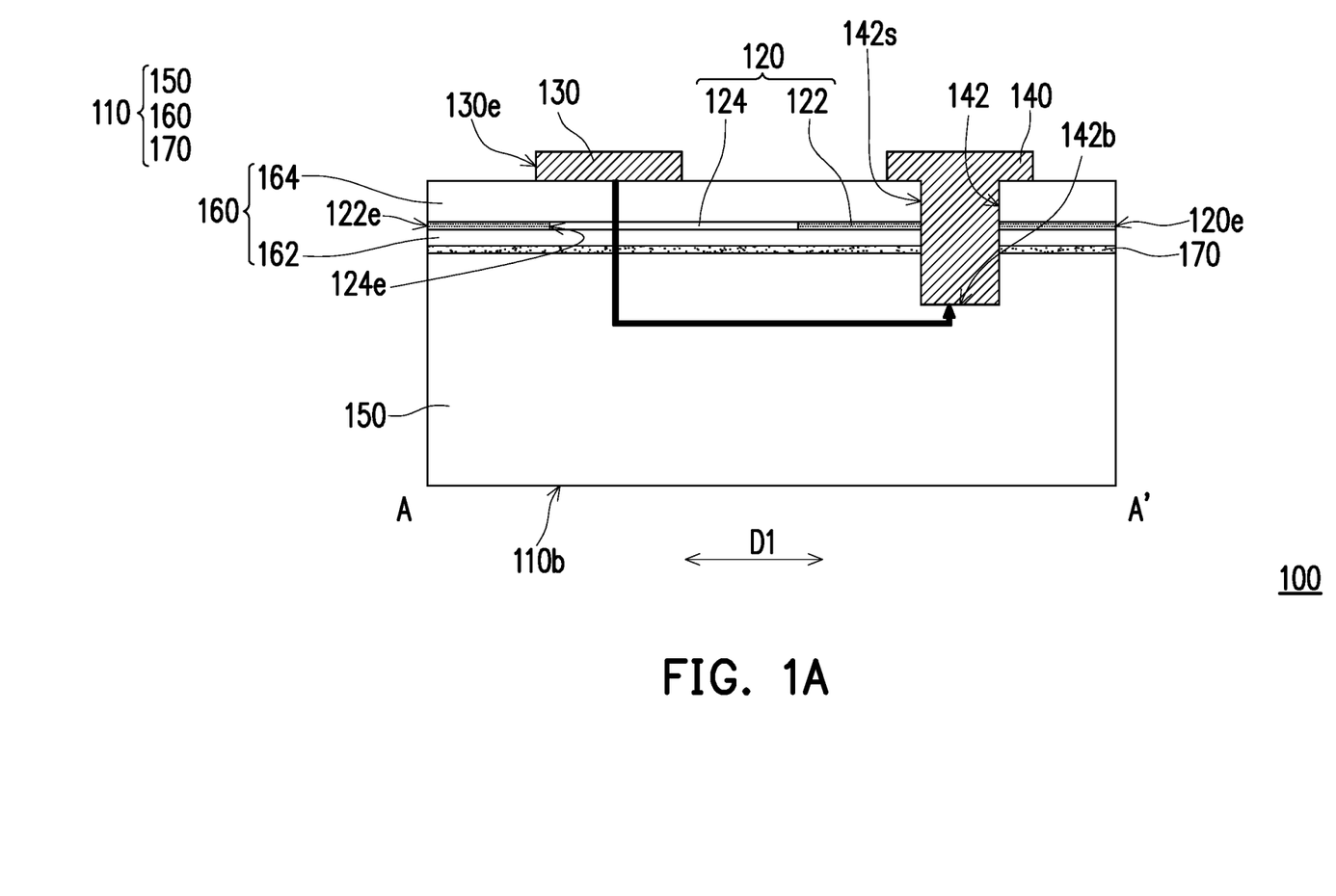
FIG. 1A is a schematic partial cross-sectional view of a micro semiconductor device according to an embodiment of the disclosure.
Figure 1B:
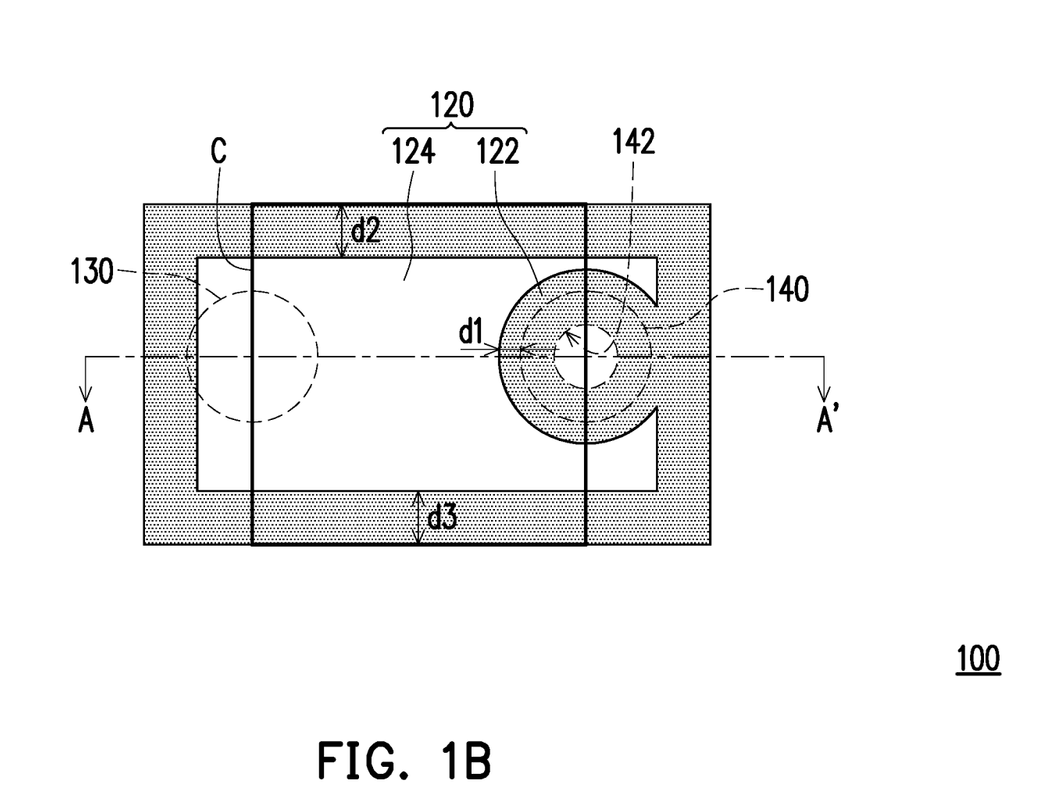

FIG. 1A is a schematic partial cross-sectional view of a micro semiconductor device according to an embodiment of the disclosure. FIG. 1B is a schematic top view of the micro semiconductor device of FIG. 1A, where FIG. 1A is a partial cross-sectional view along a line A-A' in FIG. 1B.

Please refer to FIGS. 1A and 1B. In this embodiment, a micro semiconductor device 100 includes a semiconductor structure 110, a current confinement layer 120, a first type electrode 130, and a second type electrode 140. The current confinement layer 120 is disposed in the semiconductor structure 110. The first type electrode 130 and the second type electrode 140 are both disposed on the current confinement layer 120.

In some embodiments, the semiconductor structure 110 is, for example, formed of a semiconductor material applicable for epitaxy, but the disclosure is not limited thereto.

In some embodiments, the first type electrode 130 may be a p-type electrode, and the second type electrode may be an n-type electrode, but the disclosure is not limited thereto.

In this embodiment, the current confinement layer 120 is, for example, formed of a semiconductor material that may be selectively oxidized, so that the current confinement layer 120 may include a partial oxidized area configured to control the direction of current flow between electrodes. For example, the current confinement layer 120 may be selectively oxidized to form an oxidized area 122 and a non-oxidized area 124 with different resistance values in the current confinement layer 120. The oxidized area 122 and the non-oxidized area 124 may be configured to control the direction of current flow between the first type electrode 130 and the second type electrode 140.

In some embodiments, the resistance value of the oxidized area 122 may be greater than the resistance value of the non-oxidized area 124, but the disclosure is not limited thereto.

In this embodiment, the current confinement layer 120 in the micro semiconductor device 100 may include the oxidized area 122 and the non-oxidized area 124. Also, an orthographic projection of a part of the oxidized area 122 on a bottom surface 110b of the semiconductor structure 110 away from the first type electrode 130 and the second type electrode 140 may be designed to be between an orthographic projection of the first type electrode 130 on the bottom surface 110b of the semiconductor structure 110 and an orthographic projection of the second type electrode 140 on the bottom surface 110b of the semiconductor structure 110. That is, at least a part of the oxidized area 122 is located between the electrodes. Alternatively, the oxidized area 122 may be designed as surrounding the first type electrode 130, the second type electrode 140, or a combination thereof. That is, the oxidized area 122 surrounds the electrodes. The direction of current flow is effectively controlled using the difference in resistance values of the oxidized area 122 and the non-oxidized area 124, so that it is difficult for current carriers to laterally diffuse between the electrodes, thereby reducing the probability of the current carriers passing through a surface defect part between the electrodes. Therefore, the micro semiconductor device 100 may reduce the probability of a surface recombination phenomenon produced by the current carriers and surface defects while reducing the generation of excess waste heat to improve negative impacts on the performance of the micro semiconductor device 100 due to the presence of the surface defects.

In this embodiment, the second type electrode 140 may have a through hole 142 extending toward the bottom surface 110b of the semiconductor structure 110. The through hole 142 is, for example, formed by a dry etching process, so when the through hole 142 is formed, surface defects are formed on the sidewall thereof. Therefore, when at least a part of the oxidized area 122 is designed to be located between the electrodes or when the oxidized area 122 is designed to surround the electrodes, the current carriers are enabled to, for example, pass from the first type electrode 130 downward through the non-oxidized area 124 of the current confinement layer 120, and then flow from a bottom 142b of the through hole 142 to the second type electrode 140. The current path may be as shown by the arrow direction in FIG. 1A, so that it is difficult for the current carriers to laterally diffuse between the electrodes, so as to reduce the current carriers passing through a surface defect part on the sidewall of the through hole 142, thereby reducing the probability of a surface recombination phenomenon produced by the current carriers and surface defects while reducing the generation of excess waste heat to improve negative impacts on the performance due to the presence of the surface defects.

In some embodiments, the oxidized area 122 may be located around the second type electrode 140 and the edge of the micro semiconductor device 100 at the same time. Therefore, the oxidized area 122 may surround the first type electrode 130 and the second type electrode 140 at the same time, and has a circular contour (as shown in FIG. 1B) surrounding the through hole 142 of the second type electrode 140, but the disclosure is not limited thereto.

In some embodiments, the through hole 142 may penetrate the current confinement layer 120 toward the semiconductor structure 110, and the bottom 142b of the through hole 142 may be located between the current confinement layer 120 and the semiconductor structure 110, but the disclosure is not limited thereto.

In some embodiments, the oxidized area 122 may cover an outer sidewall 142s of the through hole 142 and is in direct contact with the outer sidewall 142s, but the disclosure is not limited thereto.

In this embodiment, the semiconductor structure 110 may further include a first type semiconductor layer 150, a second type semiconductor layer 160, and a light emitting layer 170. The second type semiconductor layer 160 may be disposed on the first type semiconductor layer 150, and the light emitting layer 170 may be disposed between the first type semiconductor layer 150 and the second type semiconductor layer 160. Therefore, when at least a part of the oxidized area 122 is designed to be located between the electrodes or the oxidized area 122 is designed to surround the electrodes, unnecessary loss (current carriers are consumed by surface defects and cannot be used for light emission) due to a surface recombination phenomenon produced by the current carriers and the surface defects may be reduced, so as to increase the equivalent current density and improve the light emitting effect, which may be beneficial to the quantum efficiency performance of the micro semiconductor device 100, but the disclosure is not limited thereto.

In some embodiments, the first type semiconductor layer 150 is, for example, a p-type semiconductor layer, and the second type semiconductor layer 160 is, for example, an n-type semiconductor layer, but the disclosure is not limited thereto, which may be adjusted according to actual design requirements.

In some embodiments, the light emitting layer 170 is, for example, a multiple quantum well (MQW). The MQW includes alternately stacked multiple layers of indium gallium nitride (InGaN) and multiple layers of gallium nitride (GaN). The ratio of indium or gallium in the light emitting layer 170 is designed to adjust the light emitting wavelength range of the light emitting layer 170, but the disclosure is not limited thereto.

In some embodiments, the micro semiconductor device 100 may be a micro light emitting device, such as a micro light emitting diode (micro LED), and the size of the micro light emitting device may be less than or equal to 50 µm, but the disclosure is not limited thereto.

In some embodiments, when the current range of the micro light emitting device is below 10 mA, for example, between 0.1 mA and 10 mA, the micro light emitting device may have a better light emitting effect, which may be more beneficial to the quantum efficiency performance of the micro semiconductor device 100, but the disclosure is not limited thereto.

In some embodiments, the micro LED may be a horizontal type micro LED, but the disclosure is not limited thereto.

It should be noted that the disclosure does not limit the type of the micro semiconductor device 100. For example, the micro semiconductor device 100 may also be a micro semiconductor device such as a micro integrated circuit (micro IC), a micro laser diode (micro LD), or a micro sensor.

In some embodiments, the light emitting layer 170 may be disposed between the bottom 142b of the through hole 142 and the current confinement layer 120, but the disclosure is not limited thereto.

In this embodiment, the current confinement layer 120 may be located in the second type semiconductor layer 160. For example, the current confinement layer 120 may be a film layer with a certain amount of aluminum in the second type semiconductor layer 160 to effectively and selectively oxidize the current confinement layer 120, so as to form the oxidized area 122 including aluminum oxide ($AlO_2$) and the non-oxidized area 124 not including $AlO_2$, but the disclosure is not limited thereto.

In some embodiments, the second type semiconductor layer 160 may be an III-V semiconductor layer, such as a GaN layer, and the current confinement layer 120 may be a semiconductor layer such as an aluminum indium nitride ($Al_xIn_{1-x}N$) layer with a certain amount of aluminum, where $0.8 \leq x \leq 1$, and when the value of x is too small, light may be absorbed, but the disclosure is not limited thereto. It is particularly stated that the micro semiconductor device 100 at this time is, for example, a blue-green light micro LED. Therefore, the current confinement layer 120 may be epitaxially grown together with the second type semiconductor layer 160, the light emitting layer 170 and the first type semiconductor layer 150 during the epitaxial process, instead of forming the current confinement layer 120 in a subsequent photographic process, whereby the subsequent yield of the micro semiconductor device 100 increase.

In some embodiments, the second type semiconductor layer 160 may be an aluminum gallium indium phosphide (AlGaInP) layer, and the current confinement layer 120 may be semiconductor layer such as an aluminum gallium arsenide ($Al_yGa_{1-y}As$) layer with a certain amount of aluminum, where $0.9 \leq y \leq 1$, and when the value of y is too small, light may be absorbed, but the disclosure is not limited thereto. It is particularly stated that the micro semiconductor device 100 at this time is, for example, a red light micro LED. Therefore, the current confinement layer 120 may be epitaxially grown together with the second type semiconductor layer 160, the light emitting layer 170 and the first type semiconductor layer 150 during the epitaxial process, instead of forming the current confinement layer 120 in a subsequent photographic process, whereby the subsequent yield of the micro semiconductor device 100 increase.

It should be noted that the disclosure does not limit the oxide included in the oxidized area 122 in the current confinement layer 120, nor does the disclosure limit the element composition ratio of the current confinement layer 120, as long as the current confinement layer 120 includes the oxidized area 122 and the non-oxidized area 124, the same belongs to the protection scope of the disclosure.

In some embodiments, the second type semiconductor layer 160 may include a first part 162 and a second part 164. The first part 162 may be located between the current confinement layer 120 and the light emitting layer 170, and the current confinement layer 120 is located between the first part 162 and the second part 164, but the disclosure is not limited thereto.

In some embodiments, the second type semiconductor layer 160 is, for example, p-type AlGaInP or p-type aluminum gallium indium nitride (AlGaInN), and the first part 162 and the second part 164 may have different amounts of aluminum. In other words, the amounts of aluminum of the first part 162 and the second part 164 may be asymmetric, but the disclosure is not limited thereto.

In some embodiments, the first part 162 and the second part 164 are separated by the current confinement layer 120, but the disclosure is not limited thereto.

In some embodiments, the doping concentration of the first part 162 may be different from the doping concentration of the second part 164. Furthermore, the level of doping concentration in the second type semiconductor layer 160 may affect the direction of current flow. For example, when the doping concentration of the first part 162 is too high, the lateral diffusion ability of current carriers may be increased, and the ability of the confinement layer 120 to control the direction of current flow is reduced. Therefore, the doping concentration of the first part 162 may be less than the doping concentration of the second part 164, such as less than about $10^{18}$, to increase the contact resistance and reduce the probability of the doping concentration affecting the direction of current flow, but the disclosure is not limited thereto.

In some embodiments, the orthographic projection of the first type electrode 130 on the semiconductor structure 110 and the orthographic projection of the non-oxidized area 124 on the semiconductor structure 110 may at least partially overlap. For example, as shown in FIG. 1A, the orthographic projection of the first type electrode 130 on the bottom surface 110b and the orthographic projection of the non-oxidized area 124 on the bottom surface 110b may at least partially overlap but not completely overlap, so that current may flow through the non-oxidized area 124 below, but the disclosure is not limited thereto.

In some embodiments, an edge 122e of the oxidized area 122 may be substantially aligned with an edge 120e of the current confinement layer 120, but the disclosure is not limited thereto. In some embodiments, an edge 124e of the non-oxidized area 124 may be substantially aligned with an edge 130e of the first type electrode 130, but the disclosure is not limited thereto.

In some embodiments, in an arrangement direction D1 of the first type electrode 130 and the second type electrode 140, the junction between the oxidized area 122 and the non-oxidized area 124 is located between the first type electrode 130 and the second type electrode 140, but the disclosure is not limited thereto.

In some embodiments, the oxidized area 122 and the non-oxidized area 124 may have at least one junction (there are two junctions as shown in FIG. 1A). Therefore, any one or more junctions of the oxidized area 122 and the non-oxidized area 124 may be located between the first type electrode 130 and the second type electrode 140, but the disclosure is not limited thereto.

In some embodiments, the thickness of the oxidized area 122 may be substantially the same as the thickness of the non-oxidized area 124, so the current confinement layer 120 may be a film layer with uniform thickness, but the disclosure is not limited thereto.

In some embodiments, the thickness of the current confinement layer 120 may be less than or equal to 500 Å. It is relatively difficult to control the oxidation depth when the thickness of the current confinement layer 120 exceeds 500 Å with the size of the micro semiconductor device 100 less than or equal to 50 μm.

In some embodiments, the ratio of the thickness of the current confinement layer 120 to the thickness of the micro semiconductor device 100 may be less than or equal to 0.06%. When the ratio of the thicknesses is greater than 0.06%, the efficiency of the micro semiconductor device 100 may be affected.

In some embodiments, the distance between the oxidized area 122 and the first type electrode 130 may be greater than or equal to 10 nm, and a distance less than 10 nm may cause the electrical connection efficiency of the first type electrode 130 and the second type semiconductor layer 160 to be poor, but the disclosure is not limited thereto.

In some embodiments, the oxidized area 122 may include a first lateral oxidation depth d1 around the second type electrode 140, and a second lateral oxidation depth d2 and a third lateral oxidation depth d3 at the edge of the micro semiconductor device 100, as shown in FIG. 1B, the first lateral oxidation depth d1, the second lateral oxidation depth d2, and the third lateral oxidation depth d3 may be greater than or equal to 10 nm, and the current confinement effect is poor if the lateral oxidation depth is too small, but the disclosure is not limited thereto.

In some embodiments, a center part C of the micro semiconductor device 100 is a region with higher current density. As shown by the border of FIG. 1B, the area of the oxidized area 122 in the center part C accounts for 0.1% to 80% of the total area of the center part C. The current confinement effect is poor if the occupied area is too small, and the forward voltage may be too high if the occupied area is too large. Here, the center part C may be defined by the geometric center positions or centers of circle of the first type electrode 130 and the second type electrode 140.

It must be noted here that the following embodiment continues to use the reference numerals and some content of the foregoing embodiment. The same or similar reference numerals are adopted to represent the same or similar elements, and the description of the same technical content is omitted. The foregoing embodiment may be referred for the description of the omission, which will not be repeated in the following embodiment.

Figure 1C:
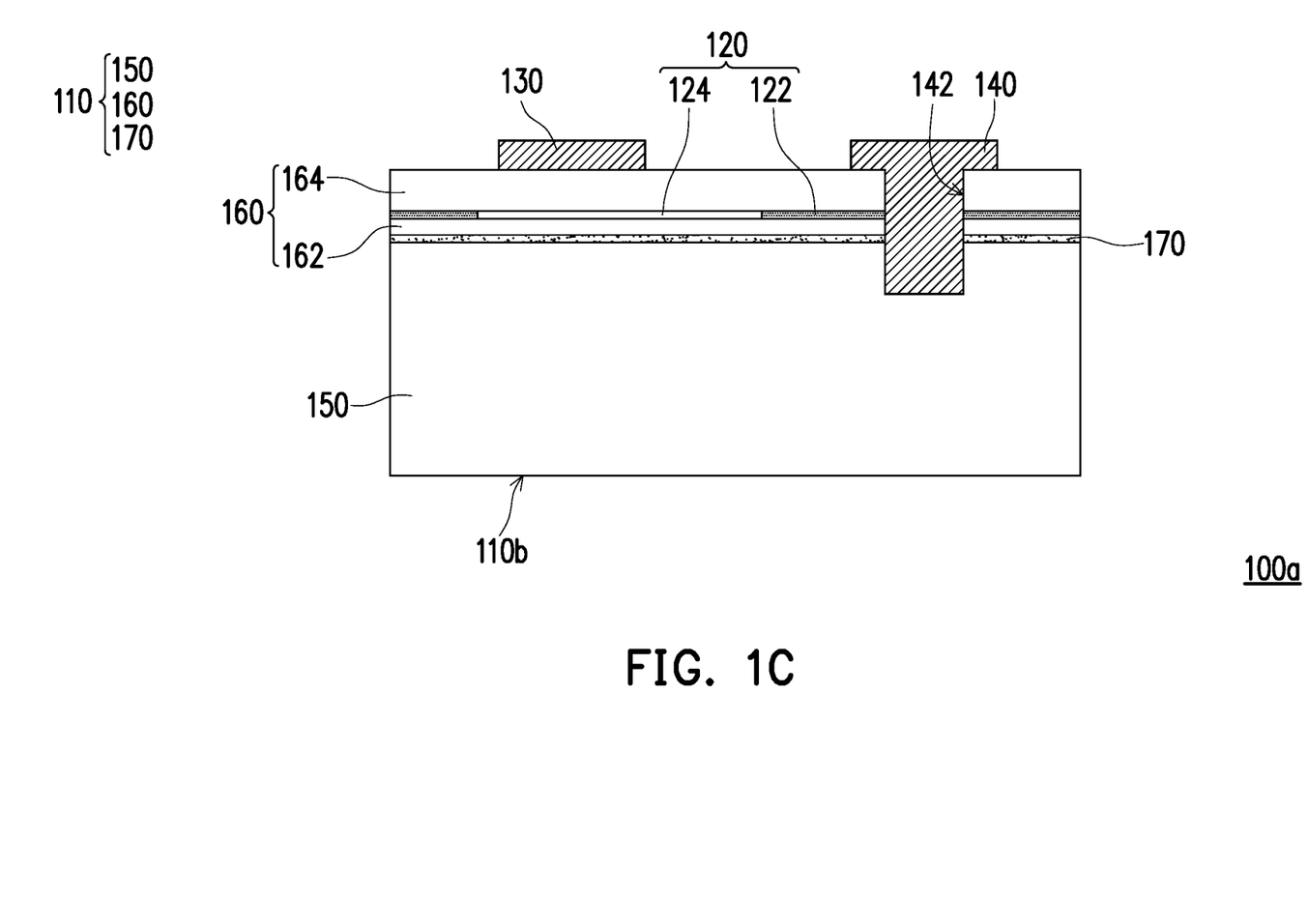
FIG. 1C is a schematic partial cross-sectional view of a micro semiconductor device according to another embodiment of the disclosure.

FIG. 1C is a schematic partial cross-sectional view of a micro semiconductor device according to another embodiment of the disclosure. Please refer to FIG. 1C. Compared with the micro semiconductor device 100, the orthographic projection of the first type electrode 130 of a micro semiconductor device 100a of this embodiment on the semiconductor structure 110 and the orthographic projection of the non-oxidized area 124 on the semiconductor structure 110 may completely overlap, but the disclosure is not limited thereto.

Figure 1D:
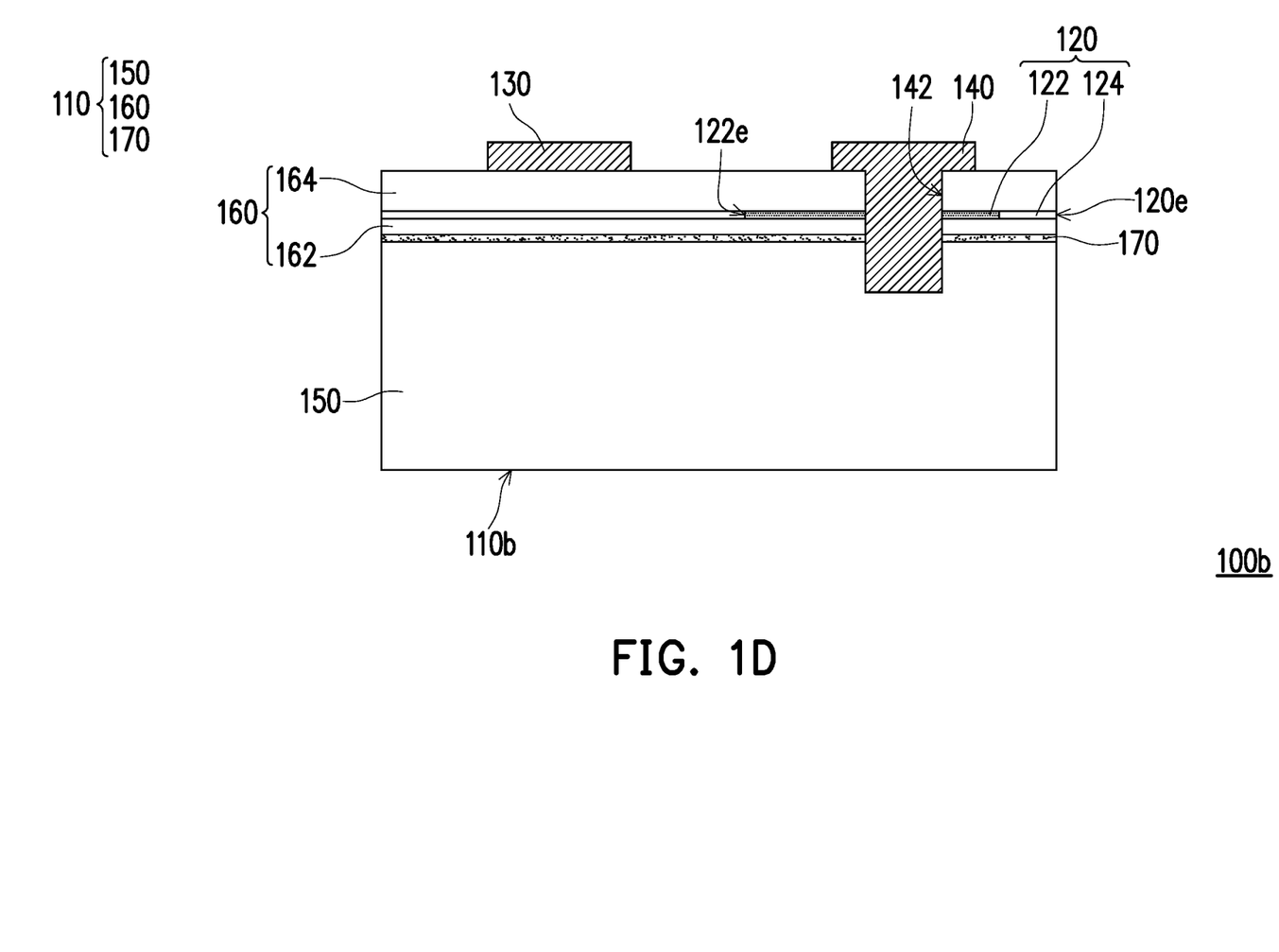
FIG. 1D is a schematic partial cross-sectional view of a micro semiconductor device according to another embodiment of the disclosure.

FIG. 1D is a schematic partial cross-sectional view of a micro semiconductor device according to another embodiment of the disclosure. Please refer to FIG. 1D. Compared with the micro semiconductor device 100, there may be a distance between the edge 122e of the oxidized area 122 and the edge 120e of the current confinement layer 120 of a micro semiconductor device 100b of this embodiment, in other words, the oxidized area 122 is only on both sides of the second type electrode 140, but the disclosure is not limited thereto.

Figure 2:
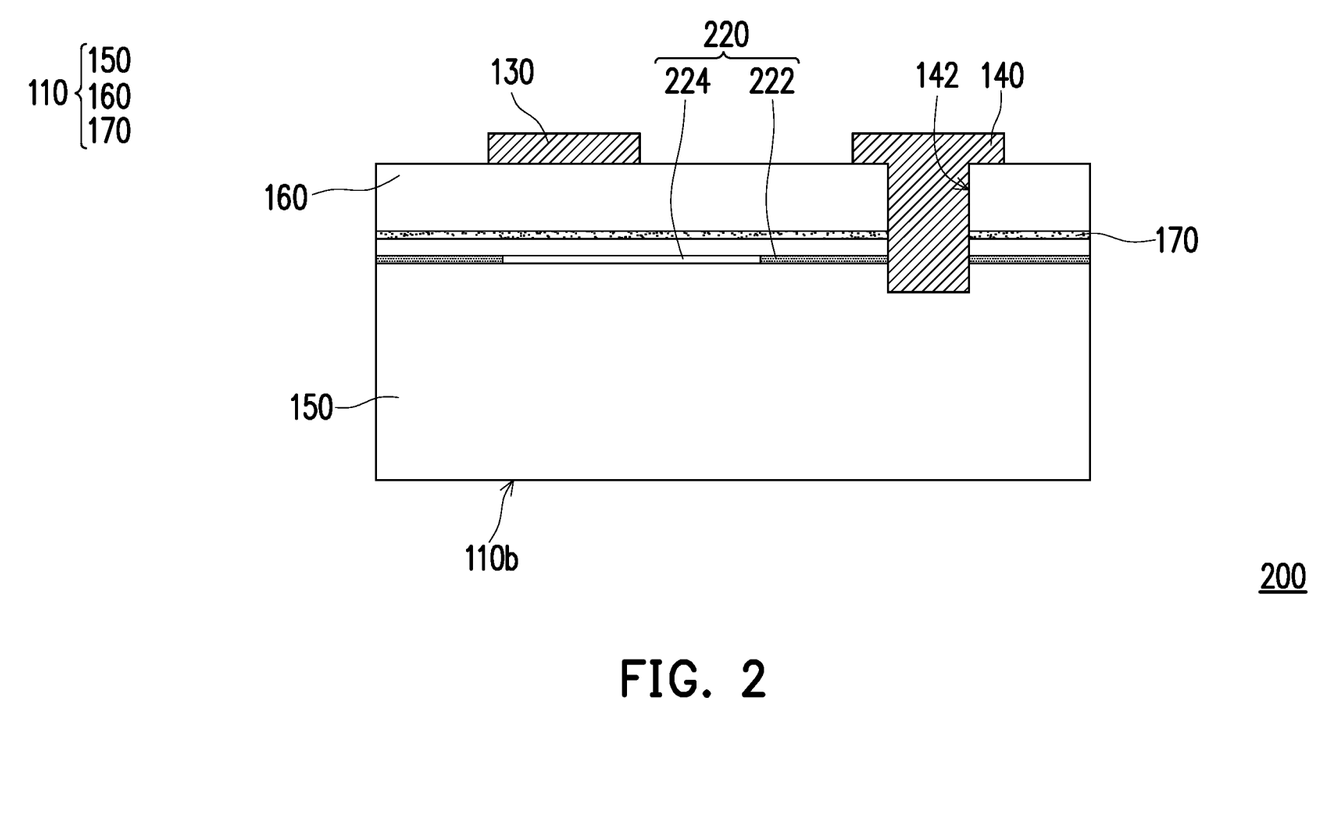
FIG. 2 is a schematic partial cross-sectional view of a micro semiconductor device according to another embodiment of the disclosure.

FIG. 2 is a schematic partial cross-sectional view of a micro semiconductor device according to another embodiment of the disclosure. Please refer to FIG. 2. Compared to the micro semiconductor device 100, a current confinement layer 220 of a micro semiconductor device 200 of this embodiment may be located in the first type semiconductor layer 150. At least a part of an oxidized area 222 of the current confinement layer 220 is located between the electrodes or the oxidized area 222 surrounds the electrodes.

In addition, the orthographic projection of the first type electrode 130 on the semiconductor structure 110 and an orthographic projection of a non-oxidized area 224 on the semiconductor structure 110 may at least partially overlap but not completely overlap, but the disclosure is not limited thereto.

Figure 3:
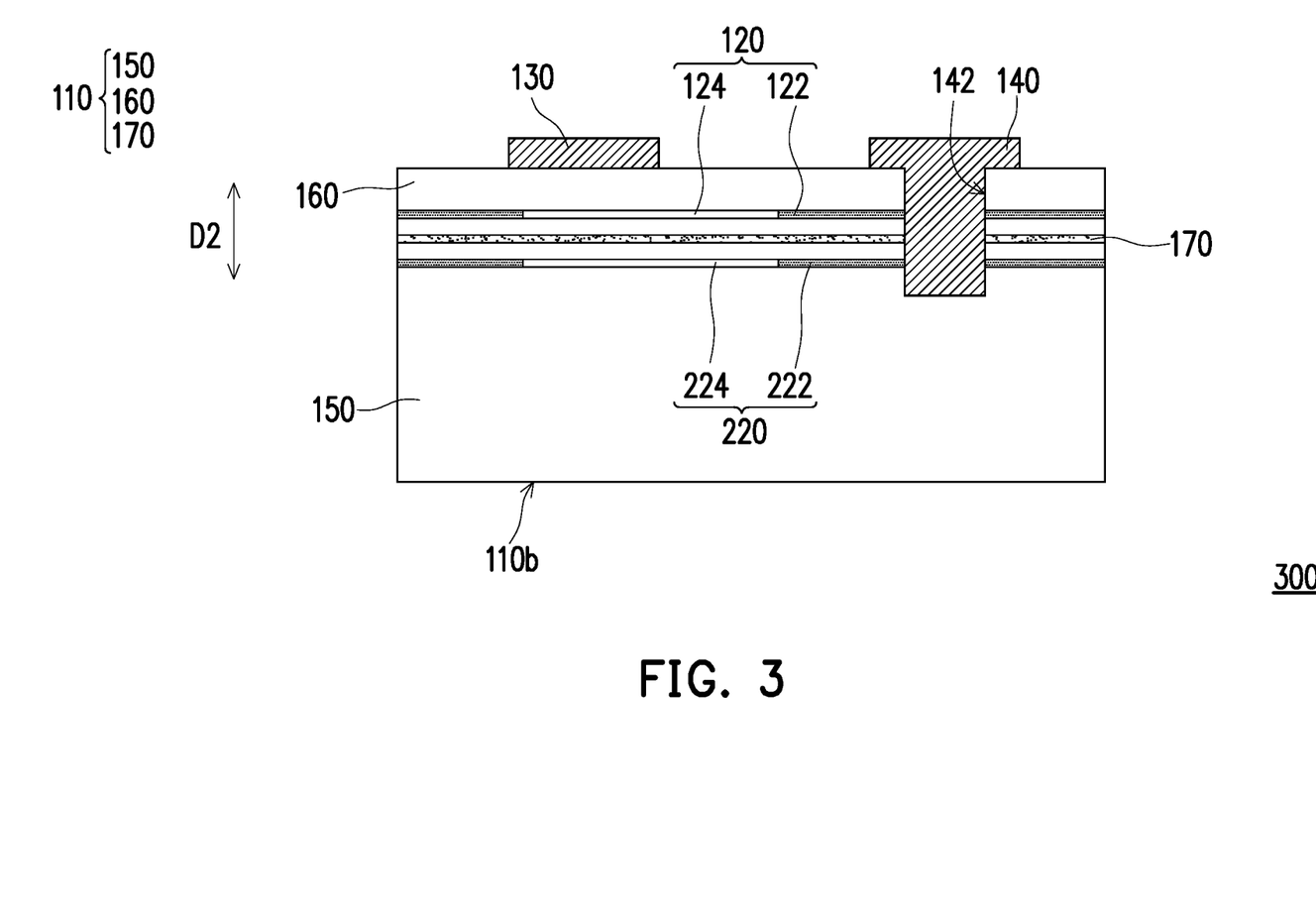
FIG. 3 is a schematic partial cross-sectional view of a micro semiconductor device according to another embodiment of the disclosure.

FIG. 3 is a schematic partial cross-sectional view of a micro semiconductor device according to another embodiment of the disclosure. Please refer to FIG. 3. Compared with the micro semiconductor device 100, the current confinement layer of a micro semiconductor device 300 of this embodiment may be at least two current confinement layers, which may increase the current confinement. For example, the at least two current confinement layers may be, for example, the current confinement layer 120 shown in FIG. 1A and the current confinement layer 220 shown in FIG. 2. The current confinement layer 220 is located in the first type semiconductor layer 150, and the current confinement layer 120 is located in the second type semiconductor layer 160, but the disclosure is not limited thereto.

In some embodiments, since too many layers of the current confinement layer will affect the structure of the micro semiconductor device, the number of layers of the current confinement layer may be greater than or equal to one layer and less than or equal to four layers, but the disclosure is not limited thereto. Here, the arrangement between multiple layers of current confinement layers and the light emitting layer may be adjusted according to actual design requirements.

In this embodiment, the non-oxidized area 124 of the current confinement layer 120 and the non-oxidized area 224 of the current confinement layer 220 may be aligned with each other in an arrangement direction D2 of the current confinement layer 120 and the current confinement layer 220, and the orthographic projections of the non-oxidized area 124 in the current confinement layer 120 and the non-oxidized area 224 of the current confinement layer 220 on the bottom surface 110b at least partially overlap, but the disclosure is not limited thereto.

Figure 4A:
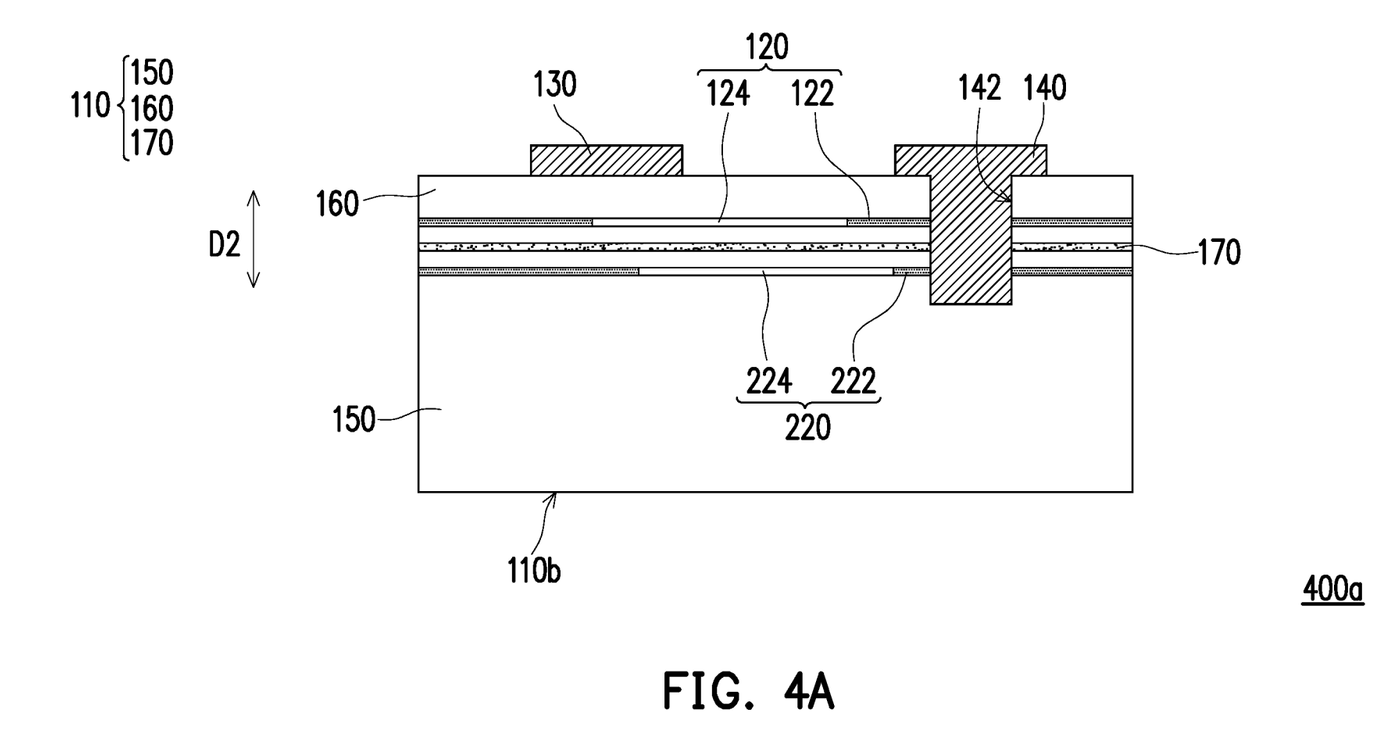
FIG. 4A is a schematic partial cross-sectional view of a micro semiconductor device according to another embodiment of the disclosure.

FIG. 4A is a schematic partial cross-sectional view of a micro semiconductor device according to another embodiment of the disclosure. Please refer to FIG. 4A. Compared with the micro semiconductor device 300, the non-oxidized area 124 in the current confinement layer 120 and the non-oxidized area 224 of the current confinement layer 220 of a micro semiconductor device 400a of this embodiment may be partially misaligned in the arrangement direction D2 of the current confinement layer 120 and the current confinement layer 220, that is, the orthographic projections of the two may at least partially not overlap. Preferably, the non-oxidized area 124 is close to the first type electrode 130, and the non-oxidized area 224 is close to the second type electrode 140, so that current may be concentrated in the middle, but the disclosure is not limited thereto.

Figure 4B:
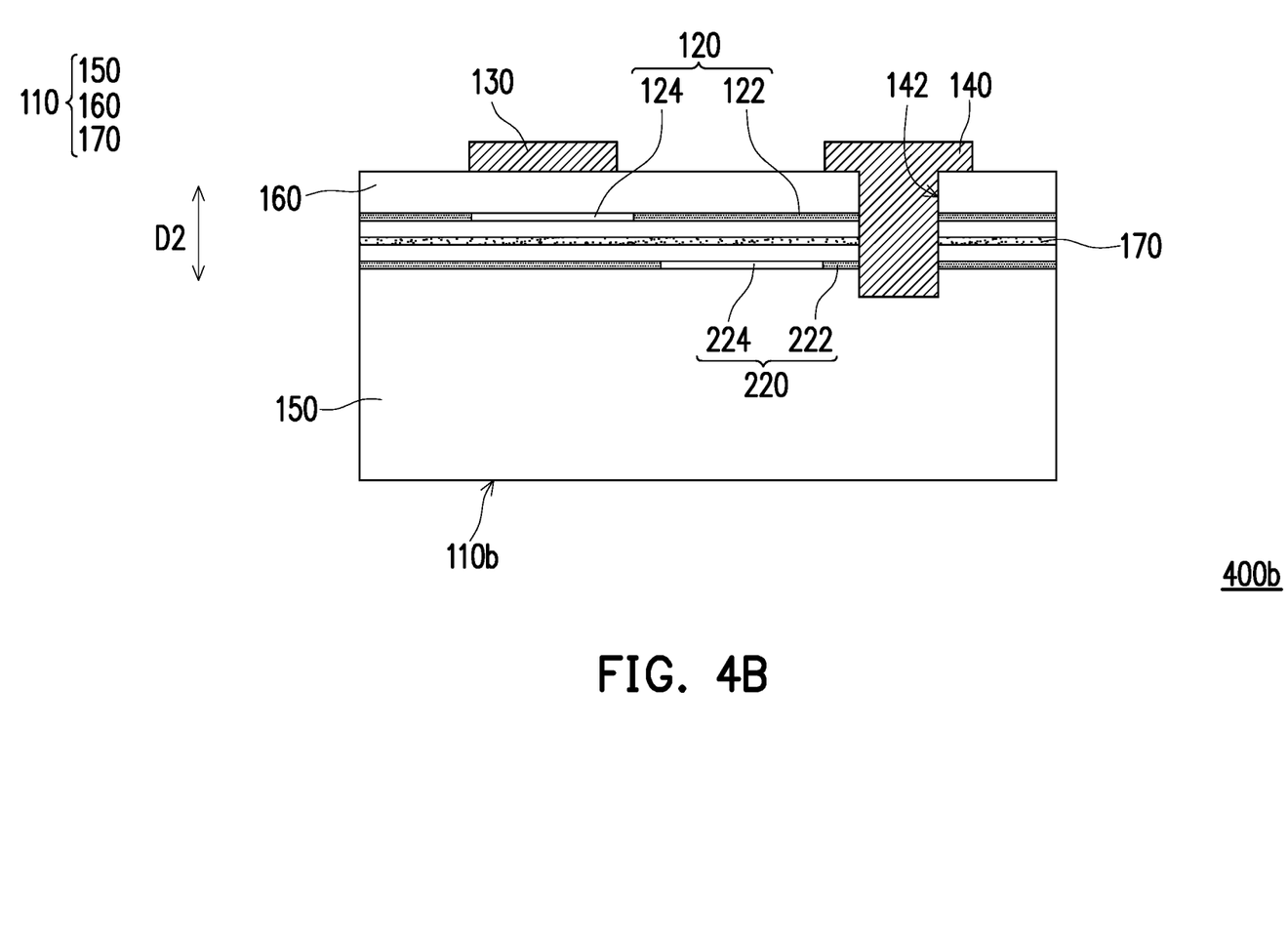
FIG. 4B is a schematic partial cross-sectional view of a micro semiconductor device according to another embodiment of the disclosure.

FIG. 4B is a schematic partial cross-sectional view of a micro semiconductor device according to another embodiment of the disclosure. Please refer to FIG. 4B. Compared with the micro semiconductor device 400, the non-oxidized area 124 in the current confinement layer 120 and the non-oxidized area 224 in the current confinement layer 220 of a micro semiconductor device 400b of this embodiment may be completely misaligned in the arrangement direction D2 of the current confinement layer 120 and the current confinement layer 220, that is, the orthographic projections of the two may completely not overlap, so as to adjust the current concentration density at a specific center position, but the disclosure is not limited thereto.

Figure 5A:
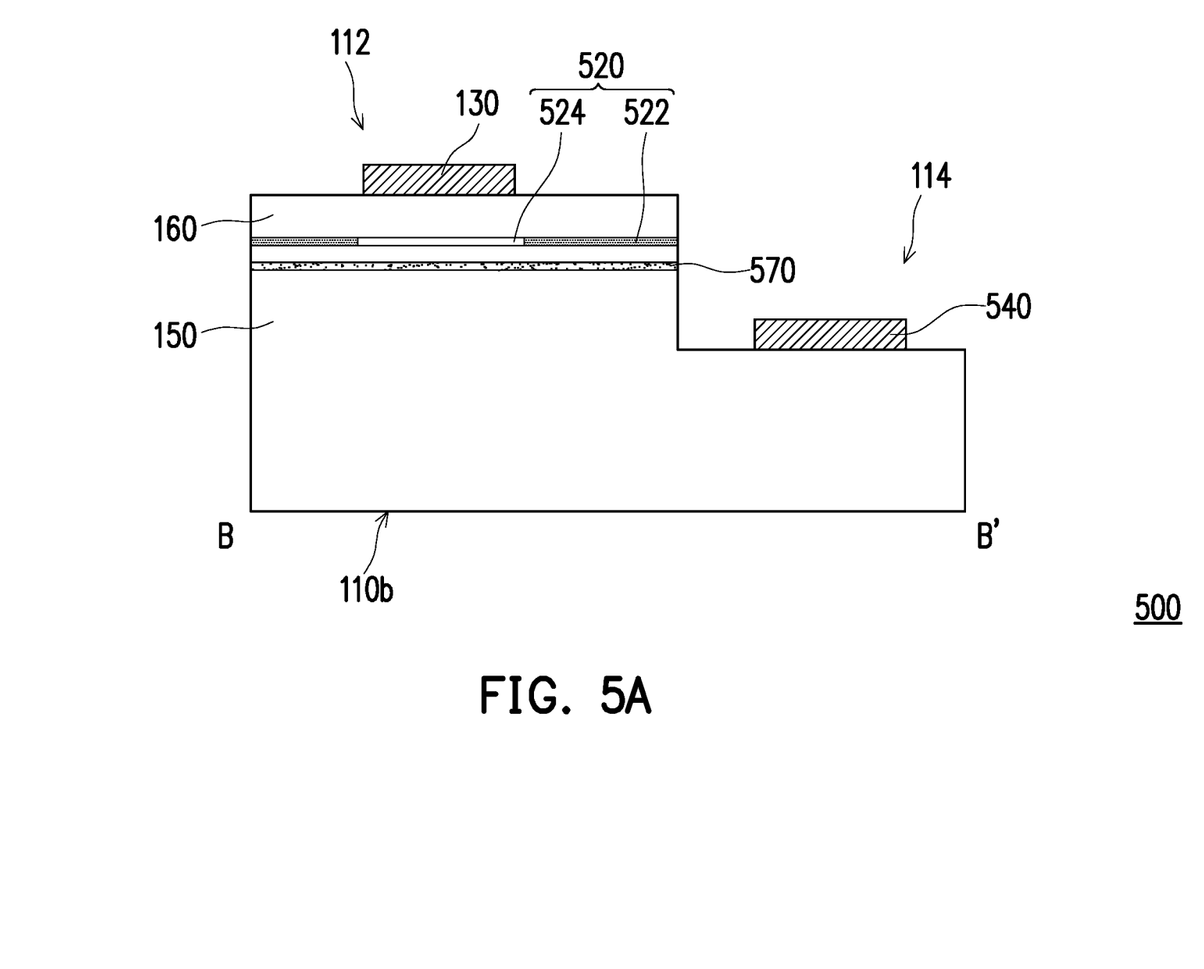
FIG. 5A is a schematic partial cross-sectional view of a micro semiconductor device according to another embodiment of the disclosure.
Figure 5B:
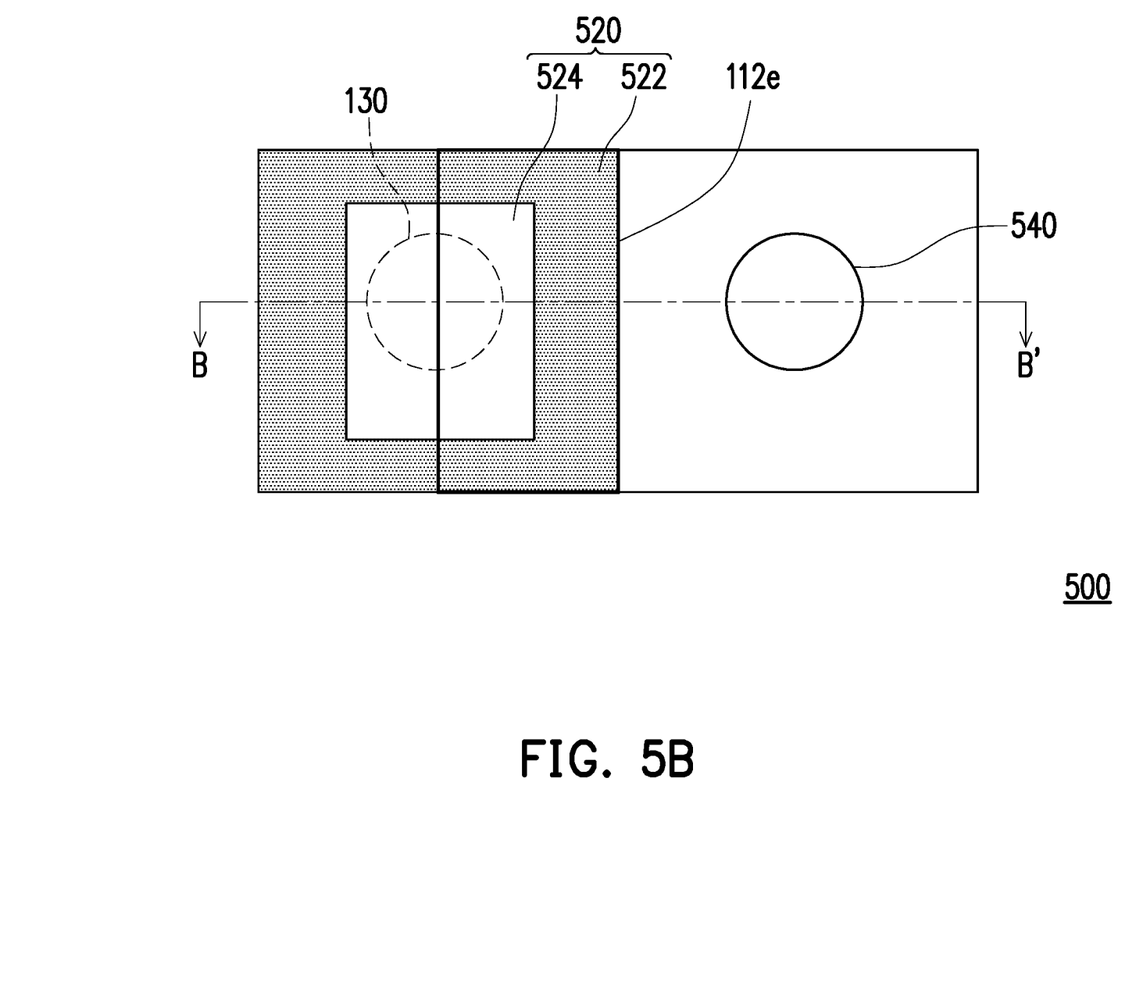

FIG. 5A is a schematic partial cross-sectional view of a micro semiconductor device according to another embodiment of the disclosure. FIG. 5B is a schematic top view of the micro semiconductor device of FIG. 5A, where FIG. 5A is a partial cross-sectional view along a line B-B' in FIG. 5B. Please refer to FIGS. 5A and 5B. Compared with the micro semiconductor device 100, a micro semiconductor device 500 of this embodiment may be a horizontal type micro semiconductor device 500 with a mesa structure. The mesa structure is, for example, an area of the micro semiconductor device 100 with height difference. For example, there may be a raised part 112 and a recessed part 114 on the semiconductor structure 110 of the micro semiconductor device 500. The first type electrode 130 is located at the raised part 112, and the second type electrode 540 is located at the recessed part 114.

Since there are surface defects between the raised part 112 where the first type electrode 130 is located and the recessed part 114 where the second type electrode 540 is located during the manufacture of the platform structure, in this embodiment, a part of an oxidized area 522 may be located between on the raised part 112 and the recessed part 114, so that it is difficult for current carriers to laterally diffuse between the electrodes, thereby reducing the probability of the current carriers passing through a surface defect part between the electrodes.

In some embodiments, the raised part 112 and the recessed part 114 may constitute a stepped structure by a connecting part, and the oxidized area 522 and the connecting part may be in direct contact, but the disclosure is not limited thereto.

In some embodiments, the oxidized area 522 and a non-oxidized area 524 in a current confinement layer 520 may be located only in the raised part 112, but the disclosure is not limited thereto.

In some embodiments, the oxidized area 522 may only surround the first type electrode 130, as shown in FIG. 5B, but the disclosure is not limited thereto.

In some embodiments, the second type electrode 540 may not have a through hole, but the disclosure is not limited thereto.

In some embodiments, the area of the oxidized area 522 in the center part (as shown by the thick border part of FIG. 5B) of the micro semiconductor device 500 accounts for 0.1% to 80% of the total area of the center part. The current confinement effect is poor if the occupied area is too small, and the forward voltage may be too high if the occupied area is too large. Here, the center part C may be defined by the geometric center position of the first type electrode 130 on the platform structure or the center of circle and an edge 112e of the raised part 112 of the platform structure.

It should be noted that the oxidized area and non-oxidized area of the disclosure are not limited to the configuration and the corresponding ratio in the foregoing embodiments, as long as at least a part of the oxidized area is located between the electrodes or the oxidized area surrounds the electrodes, the same belongs to the protection scope of the disclosure.

In summary, the current confinement layer in the micro semiconductor device of the disclosure includes the oxidized area and the non-oxidized area, and at least a part of the oxidized area is designed to be located between the electrodes or the oxidized area is designed to surround the electrodes. The direction of current flow is effectively controlled using the difference in resistance values of the oxidized area and the non-oxidized area, so that it is difficult for current carriers to laterally diffuse between the electrodes, thereby reducing the probability of the current carriers passing through a surface defect part between the electrodes. Therefore, the micro semiconductor device of the disclosure may reduce the probability of a surface recombination phenomenon produced by the current carriers and surface defects while reducing the generation of excess waste heat to improve negative impacts on the performance of the micro semiconductor device due to the presence of the surface defects. In addition, unnecessary loss (current carriers are consumed by surface defects and cannot be used for light emission) due to the surface recombination phenomenon produced by the current carriers and the surface defects may be reduced, so as to increase the equivalent current density and improve the light emitting effect, which may be beneficial to the quantum efficiency performance of the micro semiconductor device of the disclosure.

Although the disclosure has been disclosed in the foregoing embodiments, the embodiments are not intended to limit the disclosure. Persons skilled in the art may make some changes and modifications without departing from the spirit and scope of the disclosure. Therefore, the protection scope of the disclosure shall be determined by the scope of the appended claims.

What is claimed is:

1. A micro semiconductor device, comprising:
    a semiconductor structure;
    a current confinement layer, disposed in the semiconductor structure, wherein the current confinement layer comprises an oxidized area and a non-oxidized area; and
    a first type electrode and a second type electrode, both disposed on the current confinement layer, wherein:
    the first type electrode has a lower surface, wherein the lower surface is in direct contact with the semiconductor structure;
    an orthographic projection of a part of the oxidized area on a bottom surface of the semiconductor structure away from the first type electrode and the second type electrode is located between an orthographic projection of the first type electrode on the bottom surface and an orthographic projection of the second type electrode on the bottom surface; and
    the orthographic projection of the first type electrode on the bottom surface is not overlapped with the orthographic projection of the second type electrode on the bottom surface.

2. The micro semiconductor device according to claim 1, wherein a resistance value of the oxidized area is greater than a resistance value of the non-oxidized area.

3. The micro semiconductor device according to claim 1, wherein the semiconductor structure further comprises:
    a first type semiconductor layer;
    a second type semiconductor layer, disposed on the first type semiconductor layer; and
    a light emitting layer, disposed between the first type semiconductor layer and the second type semiconductor layer.

4. The micro semiconductor device according to claim 3, wherein the current confinement layer is located in the second type semiconductor layer.

5. The micro semiconductor device according to claim 4, wherein the second type semiconductor layer comprises a first part and a second part, the first part is located between the current confinement layer and the light emitting layer, and the current confinement layer is located between the first part and the second part.

6. The micro semiconductor device according to claim 5, wherein a doping concentration of the first part is less than a doping concentration of the second part.

7. The micro semiconductor device according to claim 1, wherein an edge of the oxidized area is aligned with an edge of the current confinement layer.

8. The micro semiconductor device according to claim 1, wherein a distance between an edge of the oxidized area and an edge of the current confinement layer is greater than 0.

9. The micro semiconductor device according to claim 3, wherein the current confinement layer is located in the first type semiconductor layer.

10. The micro semiconductor device according to claim 3, wherein the current confinement layer is at least two layers of current confinement layers, one of the at least two layers of current confinement layers is located in the first type semiconductor layer, and another one of the at least two layers of current confinement layers is located in the second type semiconductor layer.

11. The micro semiconductor device according to claim 10, wherein orthographic projections of a non-oxidized area of one of the at least two layers of current confinement layers and a non-oxidized area of another one of the at least two layers of current confinement layers on the bottom surface at least partially overlap.

12. The micro semiconductor device according to claim 10, wherein orthographic projections of a non-oxidized area of one of the at least two layers of current confinement layers and a non-oxidized area of another one of the at least two layers of current confinement layers on the bottom surface are completely misaligned.

13. The micro semiconductor device according to claim 1, wherein the orthographic projection of the first type electrode on the bottom surface and an orthographic projection of the non-oxidized area on the bottom surface at least partially overlap.

14. The micro semiconductor device according to claim 13, wherein the orthographic projection of the first type electrode on the bottom surface and the orthographic projection of the non-oxidized area on the bottom surface completely overlap.

15. The micro semiconductor device according to claim 1, wherein in an arrangement direction of the first type electrode and the second type electrode, a junction between the oxidized area and the non-oxidized area is located between the first type electrode and the second type electrode.

16. The micro semiconductor device according to claim 1, further comprising a center part, wherein an area of the oxidized area in the center part accounts for 0.1% to 80% of a total area of the center part.

17. A micro semiconductor device, comprising:
    a semiconductor structure;

a current confinement layer, disposed in the semiconductor structure, wherein the current confinement layer comprises an oxidized area and a non-oxidized area; and a first type electrode and a second type electrode, both disposed on the current confinement layer, wherein:

the first type electrode has a lower surface, wherein the lower surface is in direct contact with the semiconductor structure;

the second type electrode has a through hole extending toward a bottom surface of the semiconductor structure away from the first type electrode and the second type electrode;

the oxidized area surrounds the first type electrode, the second type electrode, or a combination thereof; and an orthographic projection of the first type electrode on a bottom surface of the semiconductor structure is not overlapped with an orthographic projection of the second type electrode on a bottom surface of the semiconductor structure.

* * * * *